United States Patent [19]

Chien

[11] Patent Number: 5,122,440

[45] Date of Patent: Jun. 16, 1992

[54] ULTRAVIOLET CURING OF PHOTOSENSITIVE POLYIMIDES

[76] Inventor: Chung-Ping Chien, 2204 220th Pl. N.E., Redmond, Wash. 98053

[21] Appl. No.: 519,321

[22] Filed: May 7, 1990

Related U.S. Application Data

[63] Continuation of Ser. No. 241,901, Sep. 6, 1988, abandoned.

[51] Int. Cl.$^5$ .............................. G03F 7/40; G03F 7/30
[52] U.S. Cl. ................................... 430/315; 430/313; 430/319; 430/325; 430/328
[58] Field of Search ............... 430/325, 328, 313, 315, 430/319

[56] References Cited

U.S. PATENT DOCUMENTS

| | | | |
|---|---|---|---|
| 4,567,132 | 1/1986 | Fredericks et al. | 430/328 |
| 4,624,912 | 11/1986 | Zweifel et al. | 430/258 |
| 4,661,214 | 4/1987 | Young | 204/15 |
| 4,681,778 | 7/1987 | Young | 427/96 |
| 4,696,890 | 9/1987 | Pheifer | 430/330 |
| 4,770,897 | 9/1988 | Wu | 430/315 |
| 4,855,871 | 8/1989 | Young | 361/411 |

OTHER PUBLICATIONS

Endo, A., et al., Material and processing technologies of polyimide for advanced electronic devices, J. Electrochem. Soc: Solid-State Science and Technology, 134(10):2522-2527, Oct. 1987.

Shen, W. -H., et al., Deep-ultraviolet characteristic of a photosensitive polyimide, polyimides, synthesis, Characterization, and Applications, vol. 1, Plenum Press, pp. 947-954, 1984.

Pfeifer, J. and Rohde, O., Direct photoimaging of fully imidized solvent-soluble polyimides, Second International Conference on Polyimides, Mid-Hudson Section SPE, Oct. 30-Nov. 1, 1985, Ellenville, N.Y.

Primary Examiner—Charles L. Bowers, Jr.
Assistant Examiner—J. Weddington

[57] ABSTRACT

Photosensitive polyimides used in microelectronic structures are cross-linked without exposing the associated microelectronic structures to elevated temperatures that can lower the process yield and reduce the reliability of the microelectronic structures. The photosensitive polyimides are cured by exposing them to deep ultraviolet radiation that has a spectral output effective to crosslink the polyimide. The cross-linking hardens the polyimide and renders it insoluble in solvents such as photoresist strippers.

18 Claims, 1 Drawing Sheet

ULTRAVIOLET CURING OF PHOTOSENSITIVE POLYIMIDES

This application is a continuation application based on prior copending application Ser. No. 07/241,901, filed on Sep. 6, 1988 now abandoned.

BACKGROUND OF THE INVENTION

The present invention relates to a method of curing and crosslinking photosensitive polyimides and, more particularly, to the use of such method for photolithographically patterning layers of the photosensitive polyimides and electroplating conductor seed patterns.

Photosensitive polyimides are known dielectrics having a broad range of applications in the manufacture of integrated circuits as passivation coatings, interlayered dielectrics, alpha-particle barriers, and as insulating layers in a variety of other applications. Because of the potential of reducing the number of processing steps, there has been a drive toward photoimagable polyimide systems. The development of polyimide systems that can be applied and patterned, similar to a photoresist, and remain a permanent part of the device has been a great advantage. Although improved photoimagable polyimide systems have been developed, many of these systems currently suffer from the drawback that in order to render the polyimide completely solvent insoluble, the polyimide must be heated to a temperature in excess of about 350° C.

When the polyimide layers are heated to these elevated temperatures, the associated microelectronic structures are also exposed to the elevated temperatures. This may cause several problems. For instance, chemical interaction between adjacent materials such as conductor seed lines, conductive interconnect films, or the polyimide layers can occur. Further, the elevated temperatures can cause heat-induced interdiffusion between adjacent metal layers, particularly, the delicate metal layers of the conductor seed lines. Also, the elevated temperatures can have an adverse affect on conductive films that are used as disconnect materials, particularly, those conductive films that change their conductive properties at temperatures well below the 350° C. temperature required to thermally crosslink and cure the polyimides and render them resistant to solvent attack.

Therefore, the need exists for a method of effectively crosslinking and curing the photosensitive polyimides in a manner that does not cause chemical interaction, heat-induced interdiffusion or other damage to the microelectronic structures associated with the polyimides.

SUMMARY OF THE INVENTION

The present invention is a process for crosslinking a photolithographically patterned photosensitive polyimide by exposing it to a dosage of ultraviolet radiation. The layer of photosensitive polyimide is photolithographically patterned by exposing a first portion to ultraviolet radiation having a wavelength that is strongly absorbed by the polyimide and removing second portions of the layer that were not exposed to radiation by contacting the second portions with a developing solvent. The carrier solvent for the photosensitive polyimide is desorbed from the developed layer, the layer is then cured and crosslinked by irradiating it with a dosage of ultraviolet radiation. The process provides a dielectric layer resistant to solvent attack by crosslinking and curing the photosensitive polyimide without exposing the polyimide or adjacent electronic structures to elevated temperatures that may adversely affect the performance and reliability of the electronic device.

In a related embodiment, the present invention is useful in a process for electroplating a conductor seed pattern which generally includes the steps of providing a layer containing the photosensitive polyimide over a conductor seed pattern, photolithographically patterning the layer, electroplating the conductor seed pattern, and then exposing the patterned layer to ultraviolet radiation effective to crosslink and cure the photosensitive polyimide. In a process for electroplating a conductor seed pattern, the electroplating step can also be conducted after the photosensitive polyimide has been crosslinked and cured by exposure to the ultraviolet radiation.

Other objects, features and advantages of the present invention will be readily apparent from the following description of certain preferred embodiments thereof, taken in conjunction with the accompanying drawings. It is to be understood that variations and modifications may be affected without departing from the spirit and scope of the novel concepts of the present invention.

DETAILED DESCRIPTION OF THE INVENTION

Figure 1:
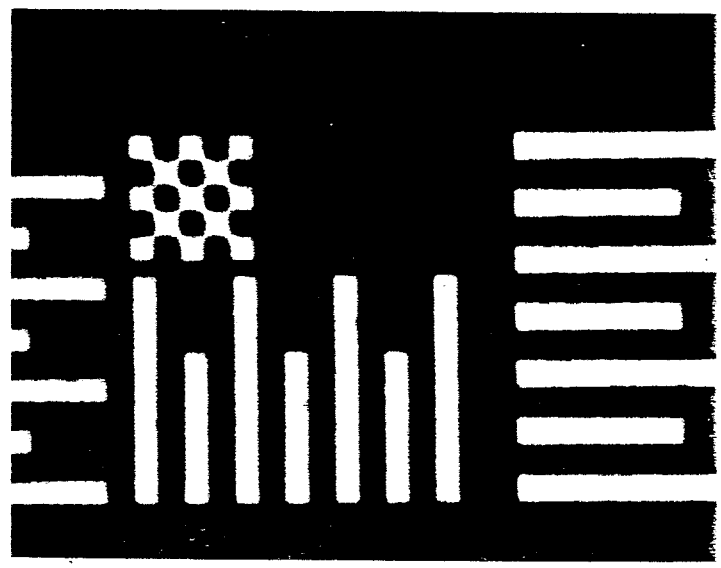
FIG. 1 is a photomicrograph of a photolithographically patterned layer of a photosensitive polyimide crosslinked and cured in accordance with the present invention.

Polyimides can be synthesized by various known methods. For example, diisocyanates can be reacted with dianhydrides, as well as their alkyl esters, to form polyimides. Another method of producing polyimides involves an amidation reaction carried out in a polar solvent to produce a high molecular weight poly (amic acid), which is then imidized by a heat treatment step. Still another method involves the reaction of dianhydrides with diamines, for example, the polymerization of pyromellitic anhydride and p-aminoaniline. It is known that certain polyimides can be rendered photosensitive by adding particular photosensitizing substituents to the polyimides.

Photosensitivity means the characteristic of the polyimides to become more resistant to solvent attack by a developing solvent after being exposed to radiation, particularly ultraviolet radiation. For example, a preferred photosensitive polyimide may be represented by the repeating structural unit:

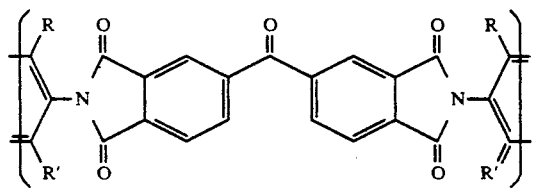

wherein R stands for an aliphatic group, such as methyl, ethyl or isopropyl, preferably methyl; R' represents an optional aliphatic substituent, which may or may not be identical to R. The addition of R' can enhance photospeed and increase the $T_g$-value of the polymer.

The photosensitive polyimides useful in the present invention are inherently photosensitive; that is, they do not require the separate photosensitizer additives found in dielectric compositions based on poly(amic acid) precursors. The photosensitivity of these polyimides is governed essentially by three factors: (1) the position of the alkyl substituent relative to the amino group, substitution in the ortho-position causes much higher photosensitivities than substitution in the meta-position; (2) the total number of ortho-substituents, photosensitivity increases with the number of substitutions; (4) the chemical nature of the ortho-substituent, the photosensitivity increasing according to the progression methyl>ethyl->isopropyl.

The unexposed photosensitive polyimides are initially susceptible to solvent attack by developing solvents used in photolithographic patterning, such as gamma-butyrolactone cyclopentanone, cyclohexanone and the like. The resistance of the photosensitive polyimides to solvent attack by the developing solvents can be increased by irradiating the polyimides with ultraviolet radiation having a wavelength greater than about 300 nanometers. Although the photoexposed polyimides are still susceptible to attack by the developing solvents, the rate at which the photoexposed polyimide dissolves in the developing solvent is much less than the rate at which the unexposed photosensitive polyimide dissolves in the developing solvent, the differences in the rate at which the exposed photosensitive polyimide and the unexposed photosensitive polyimide dissolves in the developing solvent allows the exposed portions to be developed by dissolving away the unexposed portions without dissolving away the exposed portions of the photosensitive polyimide. The photosensitive polyimides, after being photoexposed, are still susceptible to attack by stronger solvents for the polyimide such as photoresist strippers, methylethylketone, acetonitrile, SKYDROL TM available from the Monsanto Company, and N-methyl pyrollidone; it is known, however, that the photosensitive polyimides can be rendered insoluble in these stronger solvents by heating the polyimide to temperatures above about 350° C. The solubility of the polyimide can be increased by using substituted diamines, rather than wholly aromatic diamines. Examples of these types of photosensitive polyimides are commercially available under the trade name PROBIMIDE TM 400 series from Ciba-Geigy Corporation.

Photosensitive polyimides are normally photolithographically patterned by: (1) forming a layer of the photosensitive polyimide over the substrate; (2) exposing the layer to a pattern of light, such as ultraviolet light that is strongly absorbed by the polyimide, the pattern of light corresponding to the configuration of the polyimide layer desired; (3) developing the exposed portions of the dielectric layer with a developing solvent in which the exposed portions of the photosensitive polyimides dissolve much slower than the unexposed portions of the photosensitive polyimide; (4) desorbing solvent from the polyimide layer; and (5) crosslinking and curing the dielectric layer by heating it to a temperature greater than about 350° C.

Normally, the ultraviolet radiation that is used to pattern the photosensitive polyimide has a wavelength greater than about 300 nanometers. The particular wavelength used to photopattern the photosensitive polyimide is determined by primarily considering the ultraviolet absorption peaks of the photosensitive polyimide. In order to most effectively photopattern the polyimide, the radiation used should have a wavelength that is strongly absorbed by the polyimide. For example, photosensitive polyimides available under the trade name PROBIMIDE TM 400 series are effectively photopatterned by exposure to radiation having a wavelength between about 350 and 450 nanometers. Although ultraviolet radiation satisfying this criteria is effective to reduce the rate at which the photosensitive polyimide dissolves in the developing solvents, it is not effective to desorb any remaining solvent in the polyimide layer or render the polyimide resistant to solvent attack by the stronger solvents, such as those discussed above. Therefore, after the photolithographically patterning step, it is first necessary to heat the layer to about 220° C. to desorb any remaining solvent from the polyimide layer. After the solvent is desorbed, it is necessary to crosslink and cure the photosensitive polyimide in order to harden the photosensitive polyimide and render it resistant to solvent attack by most solvents, including the stronger solvents for the polyimide described above.

Conventional means of crosslinking a photolithographically patterned photosensitive polyimide require that the polyimide be exposed to temperatures in excess of about 350° C. Unfortunately, exposing the polyimide to temperatures above 350° C. also exposes the other microelectronic components associated with the polyimide to the elevated temperatures. This has a detrimental affect on the performance and reliability of the final product. For instance, the elevated temperatures can induce significant chemical interactions between the polyimide and the underlying components. The elevated temperatures can also cause melting and alloying of adjacent metal layers within the structure, particularly the delicate metal layers of the conductor seed lines and the conductive films used as disconnect materials. In the present invention, the polyimide is crosslinked by exposing it to a dosage of ultraviolet radiation effective to crosslink and cure the photolithographically patterned photosensitive polyimide so that it is resistant to attack by most solvents, including the strong solvents described above.

In the context of the present invention, it has been found that the photosensitive polyimides can be effectively crosslinked and rendered resistant to chemical attack by most solvents by exposing the polyimide to a dosage of ultraviolet radiation of at least about 75 Joules/cm$^2$/micron, preferably, the dosage of ultraviolet radiation is at least about 100 Joules/cm$^2$/micron. Within the context of the present invention, dosages of ultraviolet radiation less than 75 Joules/cm$^2$/micron may also be equally effective so long as they provide a crosslinked polyimide that is resistant to solvent attack and essentially insoluble in most solvents encountered during the fabrication of microelectronic structures. At the lower dosages, near 75 Joules/cm$^2$/micron, the chemical resistance of the photosensitive polyimide is less compared to the chemical resistance of a photosensitive polyimide exposed to a dosage of ultraviolet radiation of about 100 Joules/cm$^2$/micron or more. In accordance with the present invention, the dosages of ultraviolet radiation should be provided by exposing the photosensitive polyimide to radiation in the deep ultraviolet spectrum having a wavelength greater than about 200 nanometers and less than about 280 nanometers for a period of time that will be dependent upon the thickness of the polyimide film, the dosage of radiation, and the intensity of the radiation source. For example, a radiation source having an intensity of $$50 \frac{mw}{cm^2}$$

and a wavelength of about 240 nanometers will cure a 2 micron deep layer of polyimide by providing a dosage of about 100 Joules/cm$^2$/micron in about 60 minutes. The greater the intensity of radiation provided by the ultraviolet radiation source, the shorter will be the time required to cure and crosslink the polyimide in accordance with the present invention. The dosage of the ultraviolet radiation is in the units of energy (Joules)/area (cm$^2$)/depth of the photosensitive polyimide (micron) and can be provided by conventional means such as flood exposing type ultraviolet lamps available from American Ultraviolet Company combined with a reflecting mirror. The lamps are generally placed within about 5.0 cm of the photosensitive polyimide, preferably, the distance between the lamp and the polyimide is equal to the focal length of the reflecting mirror.

In accordance with the present invention, the use of ultraviolet radiation within the wavelengths described above, to cure and crosslink the photosensitive polyimide reduces the risk of melting and alloying of heat sensitive components such as the metal conductor seed lines or the conductive films used to electrically interconnect the conductor seed lines. Heat induced chemical interaction between the polyimide and underlying metal layers can also be avoided by curing the photo-patterned polyimide in accordance with the present invention. Another advantage of the present invention is evident in the production of integrated circuits and high density interconnect structures that require the electroplating of conductor seed lines in order to provide the required circuitry.

In producing integrated circuits or high density multilayer interconnect structures, conventional conductor seed patterns which initially define the circuitry within a particular microelectronic device must be electroplated to provide the final conductor line pattern. Conventional methods of providing the conductor seed pattern can be used with the present invention, an example of such method includes the steps of first depositing a very thin (up to 2,500 angstroms) seed layer including a titanium adhesion layer (up to 500 Å) and a gold top layer (up to 2,000 Å) onto a silicon wafer. The plated seed layer is then patterned with a conventional photoresist composition. The portions of the plating seed layer that are not covered by the resist mask are etched to remove the uncovered portions of the seed layer, thus defining the conductor seed patterns. Thereafter, the photoresist is removed by contacting it with a solvent.

In order to electroplate the conductor seed pattern, it is simpler and more efficient to electrically connect all the conductor seed lines so they can be treated as a single electrode and connected to a voltage source using a single connection. The method of electrically connecting the conductor seed lines must be such that after the electroplating step, the electroplated conductor seed lines can be electrically disconnected to provide the desired isolated circuitry. One means of electrically connecting the conductor seed lines includes providing a conductive film between unconnected conductor seed lines. Reference is made to U.S. Pat. No. 4,661,214, which is incorporated herein by reference, and discloses exemplary methods of providing conductive films between adjacent conductor lines. The particular conductive film which is used to connect the adjacent conductor seed lines must be capable of being rendered electrically nonconductive. For instance, in the '214 patent, the conductive film can be rendered nonconductive by exposure to temperatures above about 250° C. Therefore, when conductive films similar to those disclosed in the '214 patent are used, the conductor seed lines and conductive film should not be exposed to temperatures in excess of about 250° C. prior to the electroplating step; otherwise, the conductive film will become nonconductive and result in some of the conductor seed lines being electrically isolated from other lines. Without the electrical connections, the isolated lines will not be electroplated when the voltage is applied and the pattern is placed in the plating bath.

Therefore, when it is desirable to cure and crosslink the photosensitive polyimide prior to the electroplating step, the use of thermal energy (i.e., >350° C. bake) results in a disconnection of the conductive films before the conductor seed lines can be electroplated. The disconnection results in conductor seed lines that no longer define a single "electrode" and, thus, require multiple connections for electroplating each electrically independent circuit. The present invention provides a method whereby the photosensitive polyimide can be cured and crosslinked prior to the electroplating step without prematurely disconnecting the conductive films.

In accordance with the present invention, after the conductor seed pattern has been patterned and electrically inter-connected, a layer of the photosensitive polyimide is applied to the conductor seed pattern by conventional means, such as spin coating. The spin coating results in a uniform layer of dielectric composition having a substantially planar upper surface.

Next, the layer of the photosensitive polyimide can be heated to a temperature of about 110° C. in order to desorb a portion of the solvent in the photosensitive polyimide layer. After the initial baking step, the layer of the photosensitive polyimide is photolithographically patterned so that the portions of the conductor seed lines to be electroplated are uncovered. In the context of the present invention, the photolithographic patterning includes the steps of:

1. Irradiating the layer of the photosensitive polyimide through a mask that exposes portions of the layer which are to remain after the developing step. When electroplating conductor seed lines, the exposed portions of the layer of the photosensitive polyimide will normally correspond to those portions of the substrate that are not to be electroplated and also any conductive films that have been provided to electrically connect adjacent conductor seed lines.

2. Removing the unexposed portions of the photosensitive polyimide by contacting them with the developing solvent.

The irradiation used to expose the layer of the dielectric composition is preferably ultraviolet radiation that is strongly absorbed by the dielectric composition, normally the radiation has a wavelength ranging between about 350 to 450 nanometers. Exposure to this type of radiation at a dose of about 1.0 Joule/cm$^2$ (measured at 365 nanometers) increases the resistance of the photosensitive polyimide to solvent attack by the developing solvent. Although the photoexposed polyimide is still susceptible to attack by the developing solvent, it is believed the irradiation step, through a photocrosslinking mechanism, causes the exposed portions of the photosensitive polyimide to be dissolved much more slowly, by the developing solvent compared to the rate at which the unexposed portions of the photosensitive polyimide dissolve in the developing solvent. The developing solvent may be selected from solvents known to dissolve unexposed photosensitive polyimides, for example gamma-butyrolactone. Additional examples of developing solvents include cyclic ketones, such as cyclopentanone and cyclohexanone.

After the developing step, the photolithographically patterned layer of the photosensitive polyimide layer is baked at a temperature of about 220° C. to drive off the remaining solvent in the photosensitive polyimide layer. When the conductive films discussed above are used, a maximum temperature of 250° C. is preferred in order to desorb the solvent without causing the conductive films to become nonconductors prior to the electroplating step. The preferred temperatures may be increased in this baking step if other connection means, whose conductive properties are unaffected by the elevated baking temperatures are used to electrically connect the conductor seed lines. In any case, the temperature of this baking step should normally not exceed about 350° C., because extended baking at temperatures in excess of 350° C. result in physical distortions of the patterned dielectric and interdiffusion between the heat sensitive metal layers constituting the conductor seed lines.

The conductor seed lines that are not covered by the layer of the photosensitive polyimide are then electroplated conventionally by connecting the lines to a voltage source and immersing them in an electroplating bath, containing, for example, copper ions. When the conductive films are used to electrically connect the conductor seed lines, only one connection of the conductor seed pattern to a voltage source is required.

After the electroplating step or even before the electroplating step, the photolithographically patterned photosensitive polyimide layer can be crosslinked and cured by irradiating it with a dosage of ultraviolet radiation in accordance with the present invention. The curing of the photosensitive polyimide in this step renders the polyimide resistant to attack by most solvents, including photoresist strippers, without exposing the underlying components to normal thermal curing.

It is to be understood that modifications and changes to the preferred embodiment of the invention hereinedescribed and shown can be made without departing from the spirit and scope of the invention. The present invention has been described in the context of a process for crosslinking and curing a photolithographically patterned layer of a photosensitive polyimide. However, the invention is equally applicable to other processes that require the crosslinking and curing of a photosensitive polyimide whether it has been photolithographically patterned or not. The following examples are set forth to illustrate the invention; however, the examples are not intended as limitations thereof.

EXAMPLE 1

The surface of a 7.6 cm diameter silicon wafer is primed with an aminosilane adhesion promoter, followed by a 6000 rpm spin until dry (approximately 30-40 seconds). The wafer is then spin coated at 1800 rpm for 60 seconds with a photosensitive polyimide, available from Ciba Geigy Corporation under the trade name PROBIMIDE ™ 400 Series. The spin coating results in a 4.5 micron deep layer of the polyimide having a planar upper surface. The wafer including the polyimide is then baked in a nitrogen purged oven at 110° C. for 45 minutes, prior to exposing the layer for 4.0 minutes with a light source having a wavelength of 405 nanometers. The exposed layer of polyimide is developed by washing with gamma-butyrolactone, a developing solvent. The developed portions of the layer are then baked in an oven available from Blue M Electric Company, Blue Island, Ill., with a nitrogen purge at 215° C. for about 75 minutes to vaporize any remaining solvent in the polyimide layer.

A dosage of 100 Joules/cm$^2$/micron is applied to the approximately 2.1 micron thick layer of the polyimide by flood exposing it for 35 minutes with an ultraviolet lamp available from American Ultraviolet Company, having a wavelength of about 240 nanometers and an intensity of $$100 \frac{mw}{cm^2}.$$

The lamp is positioned 5.0 cm above the surface of the layer of polyimide. A concave reflecting mirror having a focal length of about 5.0 cm is placed above the ultraviolet lamp to reflect the radiation down towards the polyimide layer.

To evaluate the chemical resistance of the cured and crosslinked layer of the photosensitive polyimide, the wafer is soaked in Shipley 1165 photoresist stripper for 25 minutes at 92° C. Referring to FIG. 1, a photomicrograph of the surface of the wafer shows that the polyimide layer is insoluble in the photoresist stripper and is resistant to solvent attack (e.g., delamination, swelling) as evidenced by the well-defined, patterned geometry.

COMPARATIVE EXAMPLE 1

For comparison purposes only, a silicon wafer is primed, spin-coated, baked, exposed, and developed as described in Example 1. The developed portions are then baked at 250° C. in an oven available from the Blue M Electric Company, Blue Island, Ill., with a nitrogen purge for about 75 minutes. After the 250° C. bake, the layer of polyimide is evaluated for chemical resistance as in Example 1. The surface morphology of the wafer indicates that substantial delamination occurs when the polyimide is soaked in the photoresist stripper.

EXAMPLE 2

The plasma etching rate of the polyimide layer of Example 1 and Comparative Example 1 are evaluated by Reactive Ion Etching $O_2/CF_4$ plasma etching. The plasma etching rates are tabulated in Table 1 below. It was found that the polyimide layer of Example 1 exhibits a slower plasma etching rate than the plasma etching rate of the polyimide layer of Comparative Example 1.

TABLE 1

| ETCHING GAS Composition (Vol %) | | ETCHING RATE (Å/min) | |
|---|---|---|---|
| $O_2$ | $CF_4$ | Example 1 | Comparative Example 1 |
| 72 | 28 | 1900 | 2100 |
| 50 | 50 | 1100 | 1600 |
| 20 | 80 | 230 | 1100 |

Examples 1 and 2 illustrate the need to provide a final curing and crosslinking step after the second baking step in order to provide an insoluble layer that is not susceptible to solvent attack when contacted with strong solvents for polyimides, such as a photoresist stripper. Also, the final curing and crosslinking step increases the physical resistance to plasma etching of the photosensitive polyimide.

The method of the present invention has the advantage of not exposing the photosensitive polyimide and associated microelectronic components to high temperatures, e.g., above 350° C. in order to cure and crosslink the polyimide. This reduces heat induced chemical interactions and interdiffusions between adjacent metal layers of the microelectronic device. By reducing the chemical interaction and interdiffusion of materials, improved process yields and product reliability are realized.

One of ordinary skill, after reading the foregoing specification, will be able to effect various changes, substitutions of equivalents, and other alterations without departing from the broad concepts disclosed herein. It is therefore intended that the scope of Letters Patent granted hereon will be limited only by the definition contained in the appended claims and equivalents thereof.

The embodiments of the invention in which an exclusive property or privilege is claimed are defined as follows:

1. A method for photolithographically patterning a layer comprising a photosensitive polyimide, the method comprising the steps:
    exposing first portions of the layer to a first dosage of radiation;
    removing second portions of the layer that were not exposed to the first dosage of radiation; and by contacting the second portions with a developing solvent
    exposing the first portions remaining after the removing step to a second dosage of ultraviolet radiation, the second dosage of ultraviolet radiation rendering the first portions substantially insoluble in a solvent selected from the group consisting of methylethylketone, acetonitrile, and N-methyl pyrollidone.

2. The method of claim 1, wherein the second dosage of ultraviolet radiation is at least about 75 joules/centimeter$^2$/micron.

3. The method of claim 1, wherein the second dosage of ultraviolet radiation is at least about 100 joules/centimeter$^2$/micron.

4. The method of claim 1, wherein the first dosage of radiation has a wavelength ranging above about 300 nanometers.

5. The method of claim 1, wherein the photosensitive polyimide comprises a polymer represented by the structural unit:

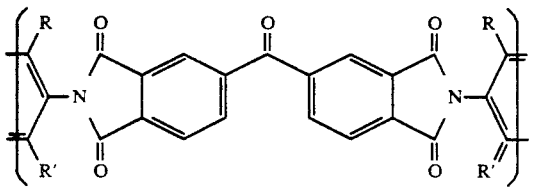

wherein R is an aliphatic group and R' is hydrogen or an aliphatic group.

6. A process for electroplating a conductor seed pattern comprising the steps:
    providing a layer comprising a photosensitive polyimide over said conductor seed pattern;
    photolithographically patterning the layer of the photosensitive polyimide by exposing first portions of the layer to a first dosage of radiation and removing the second portions of the layer that were not exposed to the first dosage of radiation by contacting the second portions with a developing solvent;
    electroplating the conductor seed pattern; and
    exposing the photolithographically patterned layer of the photosensitive polyimide to a second dosage of ultraviolet radiation, the photolithographically patterned layer of the photosensitive polyimide after being exposed to the second dosage of ultraviolet radiation being substantially insoluble in a solvent selected from the group consisting of methylethylketone, acetonitrile, and N-methyl pyrollidone.

7. The process of claim 6, wherein the second dosage of ultraviolet radiation has a wavelength ranging between about 200 and 280 nanometers.

8. The process of claim 6, wherein the second dosage of ultraviolet radiation is at least about 75 joules/centimeter$^2$/micron.

9. The process of claim 6, wherein the second dosage of ultraviolet radiation is at least about 100 joules/centimeter$^2$/micron.

10. The process of claim 6, wherein the first dosage of radiation has a wavelength ranging above about 300 nanometers.

11. A method for photolithographically patterning a layer comprising a photosensitive polyimide, the method comprising the steps;
    exposing first portions of the layer to a first dosage of radiation;
    removing second portions of the layer that were not exposed to the first dosage of radiation by contacting the second portions with a developing solvent; and
    exposing the first portions remaining after the removing step to a second dosage of radiation having a wavelength ranging between about 200 to 280 nanometers.

12. The method of claim 11, wherein the second dosage of radiation is at least about 75 joules/centimeter$^2$/micron.

13. The method of claim 11, wherein the second dosage of radiation is at least about 100 joules/centimeter$^2$/micron.

14. the method of claim 11, wherein the first dosage of radiation has a wavelength above about 300 nanometers.

15. The method of claim 11, wherein the photosensitive polyimide comprises a polymer represented by the structural unit:

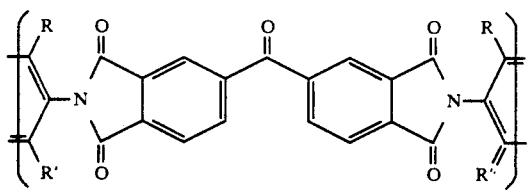

wherein R is an aliphatic group and R' is hydrogen or an aliphatic group.

16. The process of claim 6, wherein the second dosage of ultraviolet radiation has a wavelength less than about 280 nanometers.

17. The process of claim 1, wherein the second dosage of ultraviolet radiation has a wavelength less than about 280 nanometers.

18. The process of claim 1, wherein the second dosage of ultraviolet radiation has a wavelength ranging between 200 and 280 nanometers.

* * * * *

UNITED STATES PATENT AND TRADEMARK OFFICE
CERTIFICATE OF CORRECTION

PATENT NO. : 5,122,440

DATED : June 16, 1992

INVENTOR(S) : Chung-Ping Chien

It is certified that error appears in the above-identified patent and that said Letters Patent is hereby corrected as shown below:

On title page, add "Attorney, Agent or Firm: to read --Christensen, O'Connor, Johnson & Kindness--; and Add item [73] to read --The Boeing Company, Seattle, Washington,--

| Column | Line |  |
|--------|------|---|
| 3 | 13 | "methyl>ethyl" should read --methyl<ethyl-- |
| 3 | 14 | "> isopropyl" should read --< isopropyl-- |
| 3 | 30 | "dissolves" should read --dissolve-- |
| 10 | 29 | "200and" should read --200 and-- |
| 10 | 43 | "steps;" should read --steps:-- |

Signed and Sealed this

Twenty-sixth Day of July, 1994

Attest:

BRUCE LEHMAN

*Attesting Officer*   *Commissioner of Patents and Trademarks*